United States Patent
Kluge

(10) Patent No.: US 7,612,406 B2
(45) Date of Patent: Nov. 3, 2009

(54) TRANSISTOR, MEMORY CELL ARRAY AND METHOD OF MANUFACTURING A TRANSISTOR

(75) Inventor: Johannes von Kluge, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 146 days.

(21) Appl. No.: 11/517,557

(22) Filed: Sep. 8, 2006

(65) Prior Publication Data

US 2008/0061322 A1    Mar. 13, 2008

(51) Int. Cl.
*H01L 29/768* (2006.01)
(52) U.S. Cl. ............... 257/330; 257/E27.091
(58) Field of Classification Search ........ 257/213, 257/346, 302, 306, 301, 330, E27.091, E27.096
See application file for complete search history.

(56) References Cited

U.S. PATENT DOCUMENTS

| | | | |
|---|---|---|---|
| 5,502,320 A | 3/1996 | Yamada | |
| 6,063,669 A | 5/2000 | Takaishi | |
| 7,034,408 B1 | 4/2006 | Schloesser | |
| 7,129,130 B2 * | 10/2006 | Adkisson et al. | 438/243 |
| 7,393,749 B2 * | 7/2008 | Yilmaz et al. | 438/259 |
| 2001/0028084 A1 * | 10/2001 | Mo | 257/330 |
| 2006/0113588 A1 * | 6/2006 | Wu | 257/330 |
| 2006/0120129 A1 | 6/2006 | Schloesser | |
| 2006/0244024 A1 | 11/2006 | Manger | |

FOREIGN PATENT DOCUMENTS

| DE | 19928781 C1 | 7/2000 |
|---|---|---|
| EP | 1003219 A2 * | 5/2000 |

* cited by examiner

*Primary Examiner*—Allan R. Wilson
(74) *Attorney, Agent, or Firm*—Edell, Shapiro & Finnan, LLC

(57) ABSTRACT

A transistor includes a first and second source/drain regions, a channel connecting the first and second source/drain regions, and a gate electrode to control an electrical current flowing in the channel. The gate electrode is disposed in a gate groove, the gate groove being defined in a top surface of a semiconductor substrate. The first and second source/drain regions extend at least to a depth d1, the depth d1 being measured from the top surface of the substrate. A top surface of the gate electrode is disposed beneath the top surface of the semiconductor substrate. A top surface of the gate electrode is disposed at a depth d2 which is less than the depth d1, the depth d2 being measured from the substrate surface.

12 Claims, 15 Drawing Sheets

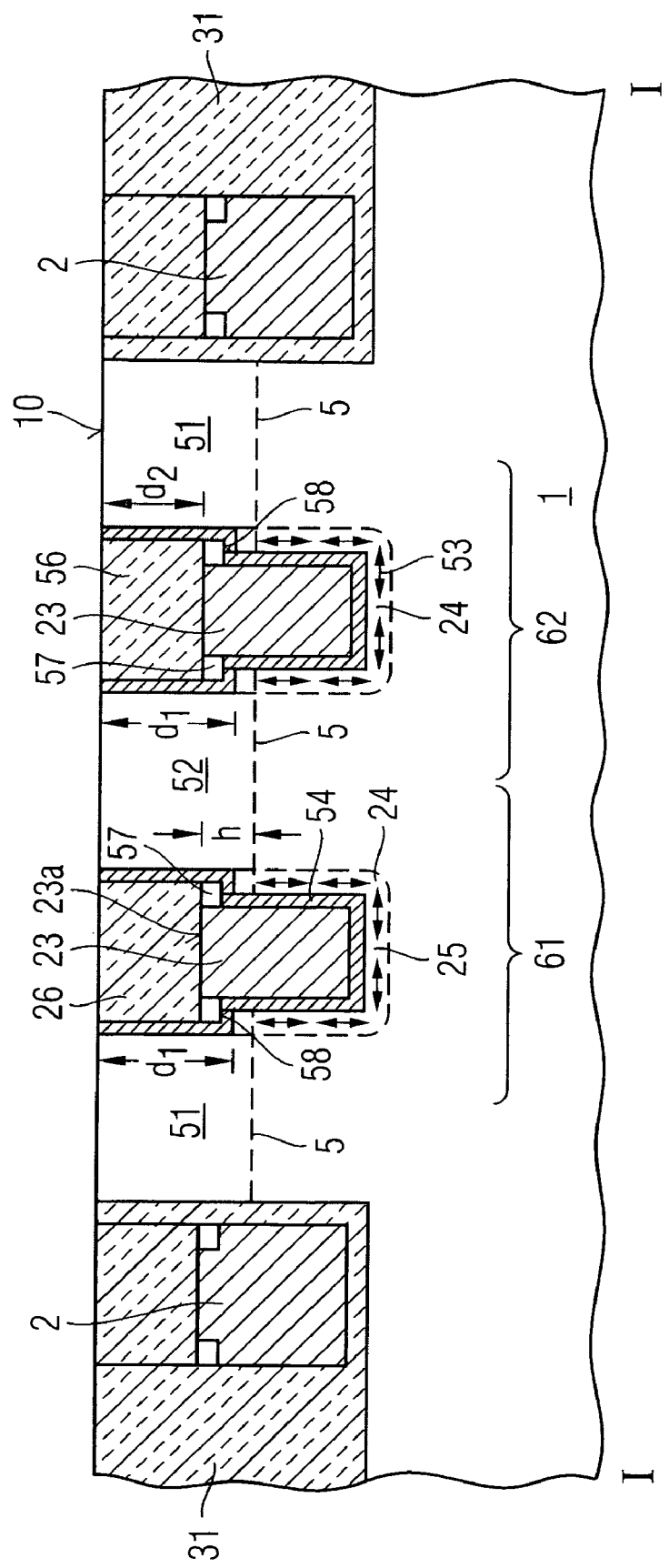

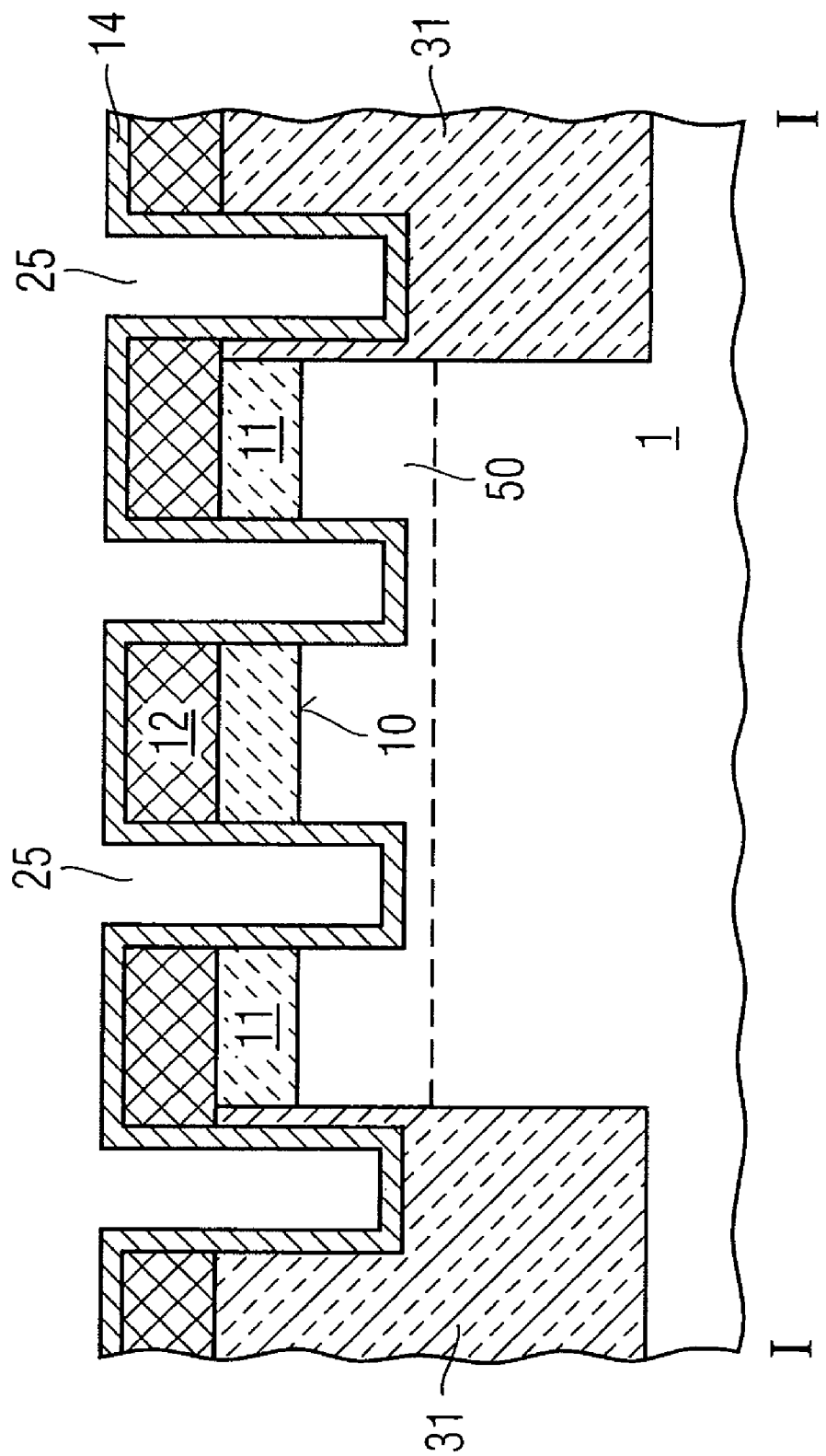

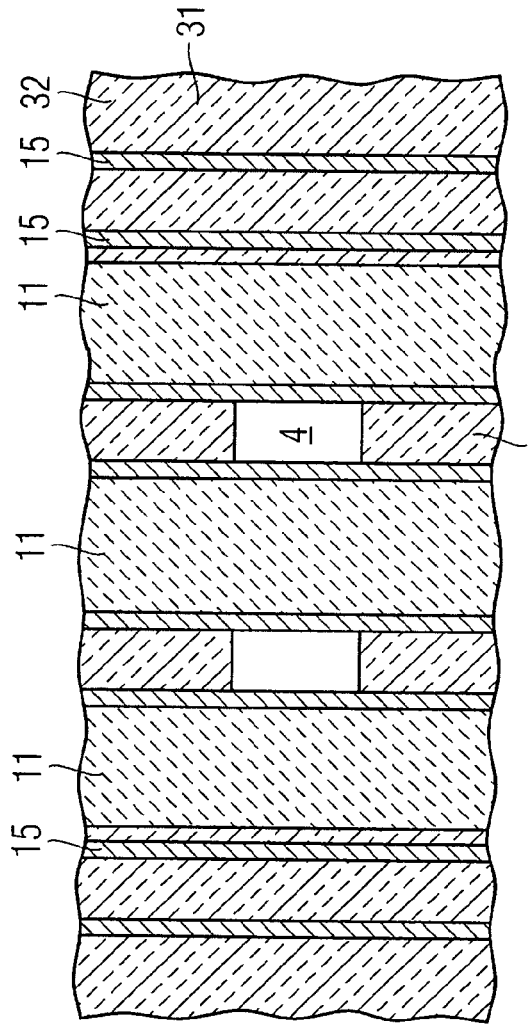
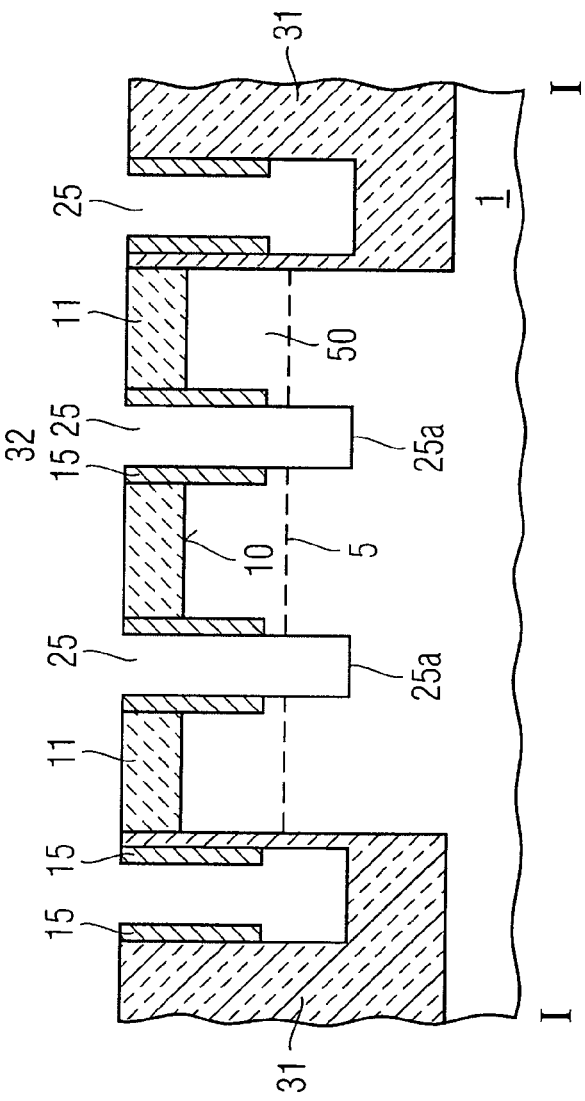
FIG 4A
FIG 4B

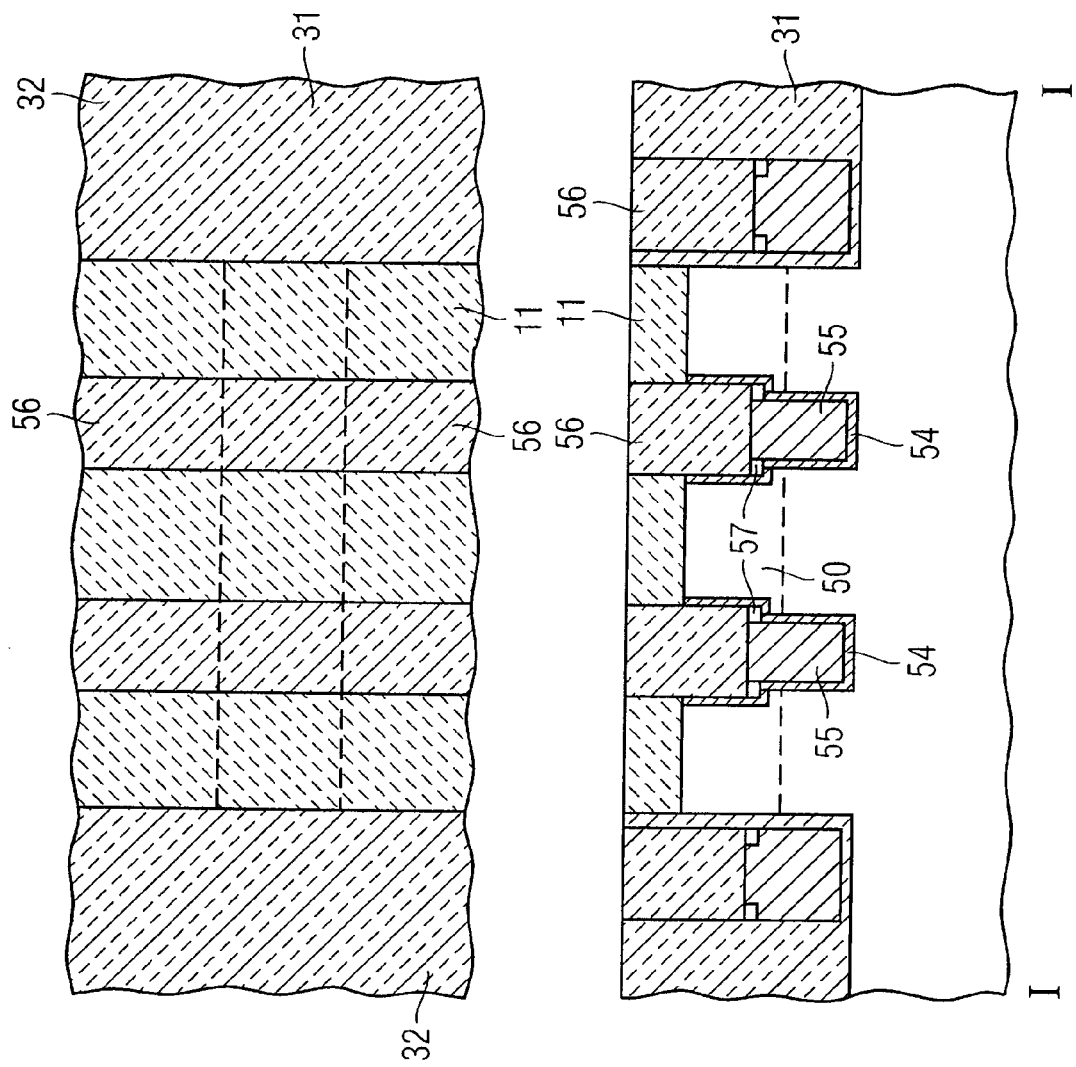

TRANSISTOR, MEMORY CELL ARRAY AND METHOD OF MANUFACTURING A TRANSISTOR

FIELD OF THE INVENTION

The invention relates to a transistor, a method of manufacturing a transistor, and to a memory cell array.

BACKGROUND

Memory cells of a dynamic random access memory (DRAM) generally include a storage capacitor for storing an electrical charge which represents an information to be stored, and an access transistor which is connected with the storage capacitor. The access transistor includes a first and a second source/drain region, a channel connecting the first and the second source/drain region as well as a gate electrode controlling an electrical current flow between the first and second source/drain region. The transistor usually is at least partially formed in the semiconductor substrate. The gate electrode forms part of a word line and is electrically insulated from the channel by a gate insulating layer. By addressing the access transistor via a corresponding wordline, the information stored in the storage capacitor is read out. In particular, the information is read out to a corresponding bitline via a bitline contact.

In conventional DRAM memory cells, the storage capacitor can be implemented as a trench capacitor in which the two capacitor electrodes are disposed in a trench which extends in the substrate in a direction perpendicular to the substrate surface.

According to another implementation of the DRAM memory cell, the electrical charge is stored in a stacked capacitor, which is formed above the surface of the substrate. Generally, attempts have been made at further shrinking the area needed for a DRAM memory cell. At the same time, it is desirable to obtain optimum characteristics of the access transistor.

Accordingly, an improved transistor as well as an improved method of manufacturing such a transistor is needed. In addition, an improved memory cell array as well as an improved method of forming such a memory cell array is needed.

SUMMARY

In accordance with the present invention, a transistor is formed in a semiconductor substrate, the substrate including a top surface. The transistor comprises a first source/drain region and a second source/drain region, a channel connecting the first and second source/drain regions, and a gate electrode to control an electrical current flowing in the channel, where the gate electrode is disposed in a gate groove. The gate groove is defined in the top surface of the semiconductor substrate, where the first and second source/drain regions extend at least to a depth $d1$, the depth $d1$ being measured from the top surface of the substrate. A top surface of the gate electrode is disposed beneath the top surface of the semiconductor substrate, and the top surface of the gate electrode is disposed at a depth $d2$ which is smaller or less than the depth $d1$, the depth $d2$ being measured from the top surface of the substrate.

A memory cell array is also provided in accordance with the invention. The memory cell array comprises memory cells, each of the memory cells comprising a storage element and an access transistor, bit lines running along a first direction, word lines running along a second direction, the second direction intersecting the first direction, a semiconductor substrate, the access transistors being formed in the semiconductor substrate, the access transistors electrically coupling corresponding storage elements to corresponding bit lines, the access transistors being addressed by the word lines, the access transistors comprising doped portions being arranged adjacent to the substrate surface, the doped portions extending to a depth $d1$, where a top surface of each of the word lines is disposed beneath the top surface of the semiconductor substrate and the top surface of each of the word lines is disposed at a depth $d2$ which is smaller or less than the depth $d1$, the depth $d2$ being measured from the substrate surface.

A transistor is also formed in accordance with the invention, where the transistor is formed in a semiconductor substrate including a top surface. The transistor comprises a first and a second source/drain region, a first direction being defined by a line connecting or extending between the first and second source/drain region, a channel connecting the first and second source/drain region, and a gate electrode to control an electrical current flowing in the channel, where the gate electrode is disposed in a gate groove, the gate groove being defined in the top surface of the semiconductor substrate. A top surface of the gate electrode is disposed beneath the top surface of the semiconductor substrate, an upper groove portion being disposed above the top surface of the gate electrode and beneath the top surface of the semiconductor substrate and the width of the upper groove portion is larger than the width of the gate electrode, the width being measured along the first direction.

A method of forming a transistor in accordance with the invention comprises providing a semiconductor substrate including a surface, providing a gate groove extending in the substrate surface, providing a first and a second source/drain region, the first and the second source/drain region being adjacent to the substrate surface, the first and second source/drain region extending to a depth $d1$ measured from the substrate surface, providing a spacer on a sidewall of the gate groove, the sacrificial spacer extending from the substrate surface to a depth which is smaller or less than $d1$, providing a gate conductive material so that a top surface of the gate conductive material is disposed beneath the top surface of the semiconductor substrate so that the top surface of the gate electrode is disposed at a depth $d2$ which is smaller or less than the depth $d1$, the depth $d2$ being measured from the substrate surface above the depth $d1$, an upper groove portion being disposed above the gate conductive material, and filling the upper groove portion with an insulating material.

Further, a transistor is formed in accordance with the invention, where the transistor is in a semiconductor substrate including a top surface. The transistor comprises a first and a second doped region, a channel connecting the first and second doped region, means for controlling an electrical current flowing in the channel, where the means for controlling the electrical current is disposed in a groove, the groove being defined in the top surface of the semiconductor substrate, where the first and second doped region extend at least to a depth $d1$, the depth $d1$ being measured from the top surface of the substrate, where a top surface of the means for controlling the electrical current is disposed beneath the top surface of the semiconductor substrate and the top surface of the means for controlling an electrical current is disposed at a depth $d2$ which is smaller or less than the depth $d1$, the depth $d2$ being measured from the substrate surface.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

It is noted that the accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other.

BRIEF DESCRIPTION OF THE DRAWINGS

FIG. 1 shows a schematic cross-sectional view of the completed transistor in accordance with the invention.

FIGS. 3A and 3B show different views of the substrate after performing an etching step and depositing a silicon nitride liner in accordance with the invention.

FIGS. 4A to 4C show different views of the substrate after performing a further etching step in accordance with the invention.

FIGS. 6A to 6C show different views of the substrate after depositing an insulating material.

DETAILED DESCRIPTION

Figures 2A, 2B:
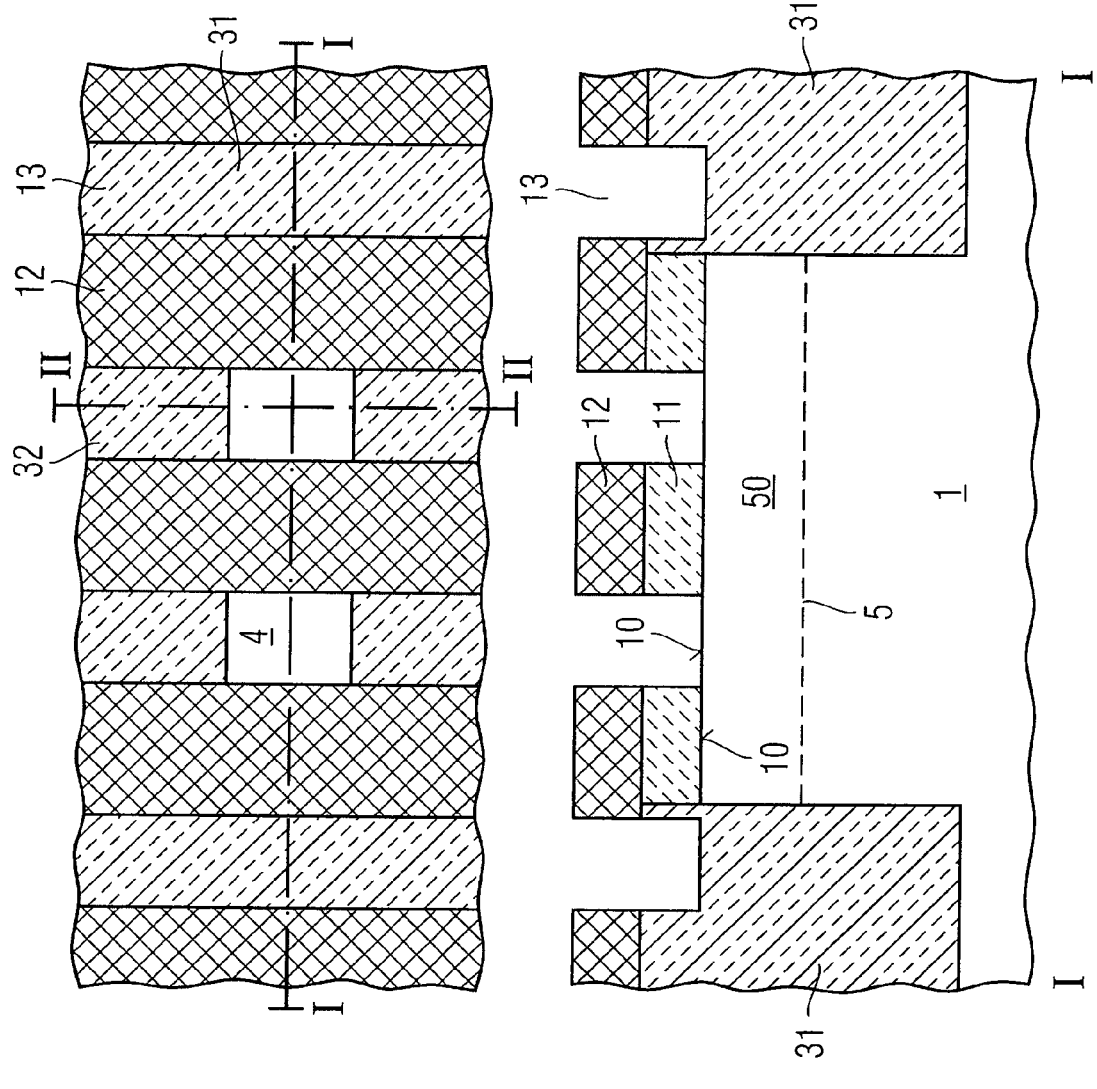
FIGS. 2A to 2C show different views of a substrate after performing first processing steps in accordance with the invention.

In the followed detailed description reference is made to the accompanying drawings, which form a part hereof and in which is illustrated by way of illustration specific embodiments in which the invention may be practiced. In this regard, directional terminology such as "top", "bottom", "front", "back", "leading", "trailing", etc., is used with reference to the orientation of the figures being described. Since components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 shows a cross-sectional view of a semiconductor substrate incorporating a first and a second transistor 61, 62 according to the present invention. In particular, each of the access transistors 61, 62 comprises a first and a second source/drain region 51, 52 which may, for example, be implemented as n-doped portions, respectively. In the shown layout, the two adjacent access transistors 61, 62 share one common second source/drain region 52. Between the first and second source/drain region 51, 52, a gate electrode 23 is provided. The gate electrode 23 extends in the substrate surface. Accordingly, a channel which is formed between the first and second source/drain region 51, 52 has a curved shape which is delimited at one side thereof by the gate electrode 23. The gate electrode 23 is insulated from the channel 53 by the gate insulating layer 54. Moreover, as can be seen from FIG. 1, optionally the gate electrode 23 further comprises plate-like portions 24 which extend in the plane before and behind the illustrated plane of the drawing. Accordingly, in this exemplary embodiment, the channel comprises a fin-like portion in which the channel has the shape of a ridge, in a cross-section which is perpendicular to the cross-sectional view shown in FIG. 1. The ridge comprises a top side and two lateral sides. Accordingly, the plate-like portions 24 of the gate-electrode delimit the channel 53 at the two lateral sides thereof. Hence, due to the presence of the plate-like portions, the channel 53 may become fully depleted.

The surface 23a of each of the gate electrodes 23 is disposed beneath the substrate surface 10. In particular, a distance between a top surface 23a of the gate electrode and the substrate surface 10 is denoted as d2. An insulating layer 56 is disposed above each of the gate electrodes 23, so as to fill the groove, in which the gate electrode is formed. Hence, the gate electrodes 23 are fully buried. Furthermore, a vacuum spacer 57 is disposed at each of the lateral sides of the gate electrode 23. The vacuum spacer 57 effectively shields the gate electrode 23 from the adjacent source/drain regions 51, 52. A bottom side 58 of the vacuum spacer is disposed above the bottom side 5 of each of the first and second source/drain regions 51, 52. Moreover, the bottom side 58 of the vacuum spacer is disposed beneath the top surface 23a of each of the gate electrodes 23. Accordingly, d2 is smaller or less than d1. In particular, as can be seen from FIG. 1, the top surface 23a of each of the gate electrodes 23 is disposed above the bottom side 5 of each of the first and second source/drain regions 51, 52. Accordingly, the conductivity of the channel 53 is controlled by the gate-electrode at the whole length of the channel. As a result, the resistance of the transistor 61, 62 is reduced. As can be taken from FIG. 1, the difference between the top side of the gate electrode 23 and the bottom side of the doped region 50 is denoted as "h". For example, h may be more than 10 or 20 nm. In addition, the bottom side of the doped region 50 is disposed at the depth d1, this depth being measured from the substrate surface 10.

In the isolation trenches 31 which are adjacent to the access transistors 61, 62, the buried wordlines 2 may be disposed, thus forming passing wordlines. Likewise, the isolation trenches 31 may be omitted, a so-called isolation device being formed at the position of these isolation trenches 31. To be more specific, in this case, the wordlines 2 are set at an appropriate voltage so as to electrically isolate the transistor 61 from the portion on the left hand side thereof, whereas the transistor 62 is electrically isolated from the right-hand side thereof. According to another embodiment trench capacitors (not shown in this drawing) may be disposed at the position of the isolation trenches 31, thus laterally insulating adjacent memory cells from each other.

As can further be seen from FIG. 1, an upper groove portion 26 is disposed above the gate electrode 23 in the gate groove 25. The upper groove portion is filled with an insulating material. As can be seen, the width of the upper groove portion 26 is larger than the width of the gate electrode, the width being measured along a first direction which is defined by a line connecting the first and second source/drain region 51, 52. For example, the width of the gate electrode 23 may include the width of the gate insulating layer 54.

A method of manufacturing the transistor shown in FIG. 1 is now explained below.

In a first step, a semiconductor substrate is provided. For example, the semiconductor substrate may be a silicon substrate, which is, for example, p-doped. After performing the usual implantations steps for providing the required well dopings, a doped portion 50 which is adjacent to the substrate surface 10 is provided by an ion implantation step. For example, this doping step is performed using an n dopant. For example, the doped portion 50 may extend to a depth d1 of approximately 50 to 100 nm. Accordingly, the bottom side 5 of the doped portion 50 is located approximately 50 to 100 nm beneath the substrate surface 10.

Thereafter, a silicon nitride layer 11 acting as a pad nitride layer is deposited by usual methods. For example, the silicon nitride layer 11 may have a thickness of approximately 100 nm. Thereafter, isolation trenches 31, 32 are defined and filled with an insulating material. By defining the isolation trenches 31, 32, also the active areas 4 are defined. For example, the active areas may be formed, having a shape of segments of lines. Alternatively, the active areas 4 may as well be formed as a continuous active area lines as will be explained later. For example the width of each of the active areas 4 corresponds to F where F is the minimal structural feature size which may be obtained by the technology employed. For example, F may be 105, 95, 85, 75, 65, 55, 40 nm or even less. After filling the isolation trenches 31, 32 with an insulating material, a hardmask layer 12 is deposited. For example, carbon may be taken as the hardmask material. In particular, such a carbon hardmask layer is made of elemental carbon, i.e. carbon which is not contained in a chemical compound, optionally including additives such as hydrogen. The carbon layer may be deposited using generally known methods like a CVD method. For example, the carbon hardmask layer 12 may have a thickness of approximately 300 nm.

After depositing the carbon hardmask layer, the carbon hardmask layer 12 is patterned, for example, using a photolithographic method as is common or conventional in the art. In particular, a photoresist material may be applied on top of the carbon hardmask layer followed by an exposure step. For example, for performing this exposure step, a mask having a lines/spaces pattern may be used. After correspondingly patterning the photoresist material, the pattern is transferred into the carbon hardmask layer 12 and the silicon nitride layer 11. For example, a selective etching step for etching silicon nitride and silicon dioxide may be performed. During this etching step, the silicon nitride layer 11 and the insulating material of the isolation trenches 31 are etched whereas silicon substrate material is not etched.

The resulting structure is shown in FIG. 2. In particular, FIG. 2A shows a plan view on the resulting structure. As can be seen, segments of active area lines 4 are formed. The active areas 4 are completely surrounded by the isolation trenches 31, 32. On top of the isolation trenches 31, 32 lines 12 of the carbon hardmask material are disposed. In the shown embodiment, the active area lines 4 perpendicularly intersect the carbon hardmask lines 12. Alternatively, the carbon hardmask lines 12 may intersect the active areas 4 at a different angle. This may, for example, be useful in a case in which the active areas 4 are implemented as continuous lines. FIG. 2B shows a cross-sectional view of the resulting structure between I and I. As is shown, the active area is delimited on each side thereof by the isolation trenches 31. The doped portion 50 is adjacent to the substrate surface 10. Hardmask openings 13 are formed. Thus, lines of the carbon hardmask 12 and the silicon nitride layer 11 are arranged on the surface 10 of the semiconductor substrate.

Figure 2C:
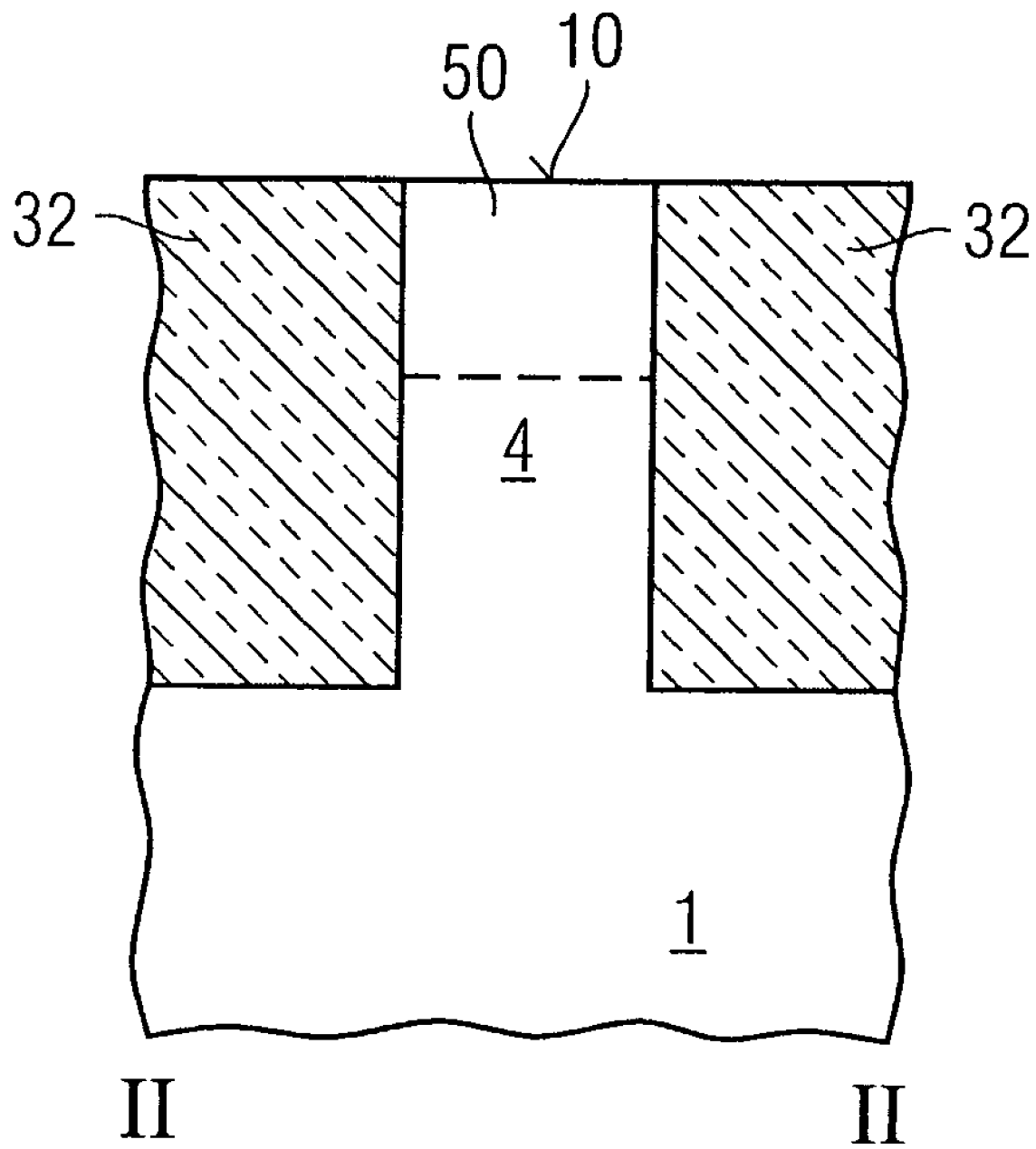

FIG. 2C shows a cross-sectional view of the resulting structure, this cross-sectional view being taken between II and II. As can be seen, an active area 4 is formed between two adjacent isolation trench portions 32. The surface 10 of the semiconductor substrate 1 is at the same level as the isolation trenches 32. For example, the isolation trenches may extend to a depth of 200 to 300 nm.

In the next step, taking the patterned hardmask material 12 as an etching mask, an unselective etching step is performed. For example, this etching step may etch silicon and silicon dioxide. In particular this etching step is performed so as to obtain an etching depth which corresponds to the height of the top surface of the gate electrode 23 to be formed. For example, this etching step may stop well above the bottom side of the doped portion 50. For example, the depth of the formed groove 25 may be 5 to 20 nm. Thereafter, a sacrificial layer 14 is deposited. For example, the sacrificial layer 14 may be made of silicon nitride, which may be deposited, for example, by a plasma CVD method. As a result, the layer 14 is formed on the whole surface.

FIG. 3A shows a cross-sectional view of the resulting structure. As can be seen, now, gate grooves 25 are formed in the surface 10 of the semiconductor substrate 1. Moreover, the entire surface is covered with the silicon nitride layer 14.

Figure 3B:
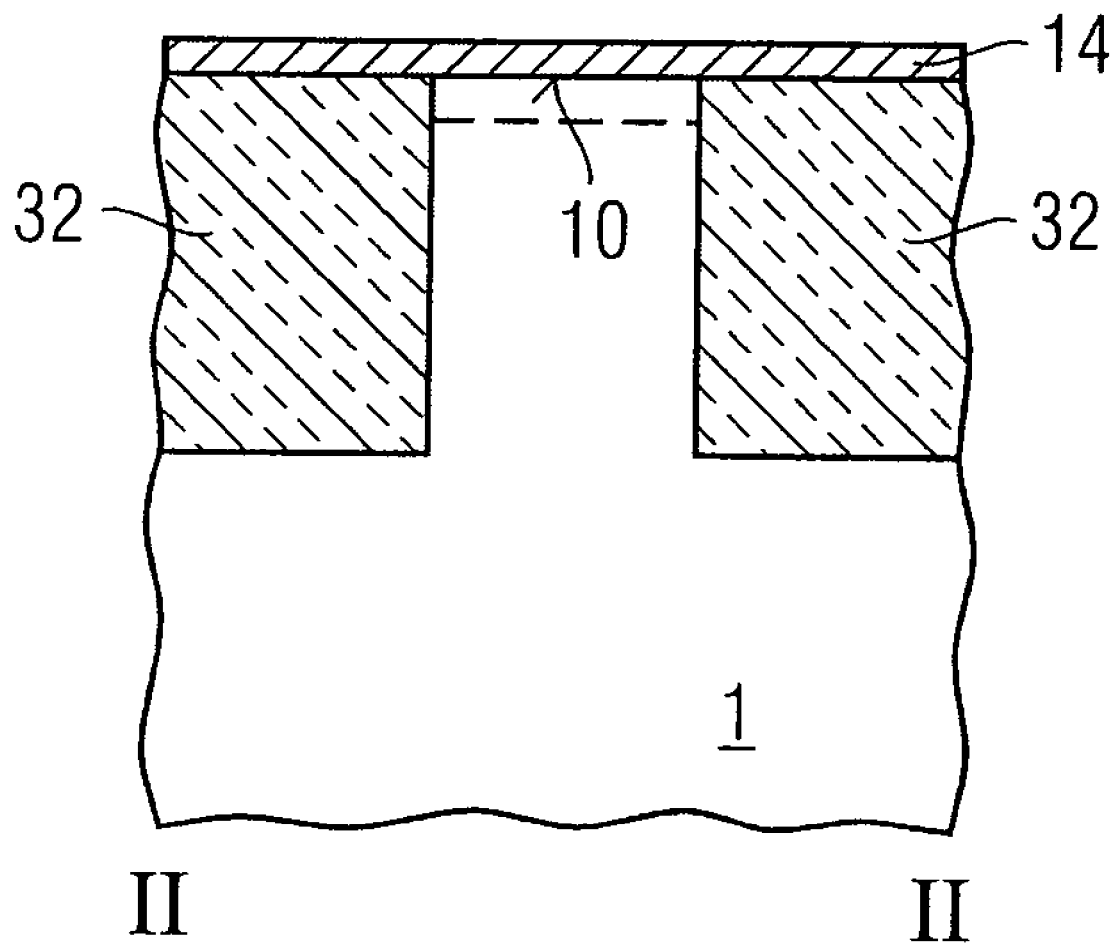

In addition, FIG. 3B shows a cross-sectional view between II and II. As can be seen, the surface of the isolation trenches 32 as well as the surface of the semiconductor substrate 1 are recessed and covered with the silicon nitride layer 14.

Thereafter, an anisotropic etching step is performed so as to remove the horizontal portions of the silicon nitride layer. As a result, a sacrificial spacer 15 is formed on the sidewall portions of each of the gate grooves 25. Thereafter, an etching step is performed which etches silicon and silicon dioxide. As a result, the gate grooves 25 are extended. As can be seen from FIG. 4B for example, the bottom side 25a of each of the gate grooves 25 now is disposed beneath the bottom side 5 of the doped portion 50. For example, the resulting gate grooves may extend to a depth of approximately 100 to 200 nm, for example 130 to 170 nm and, by way of example, 150 nm. Moreover, the width of each of the gate grooves 25 may be approximately F. Thereafter, the carbon hardmask material 12 may be stripped from the surface.

Thereafter, optionally, the plate-like portions of the gate electrode may be defined. To this end, an etching step which etches silicon dioxide selectively with respect to silicon may be performed. For example, the etching depth of the silicon dioxide material may be equal to the thickness of the sacrificial spacer 15. Consequently, the insulating material of the isolation trenches 31, 32 is etched. As a result, the active area 4 has the shape of a ridge, which is exposed at three sides thereof. The resulting structure is shown in FIG. 4.

Figure 4C:
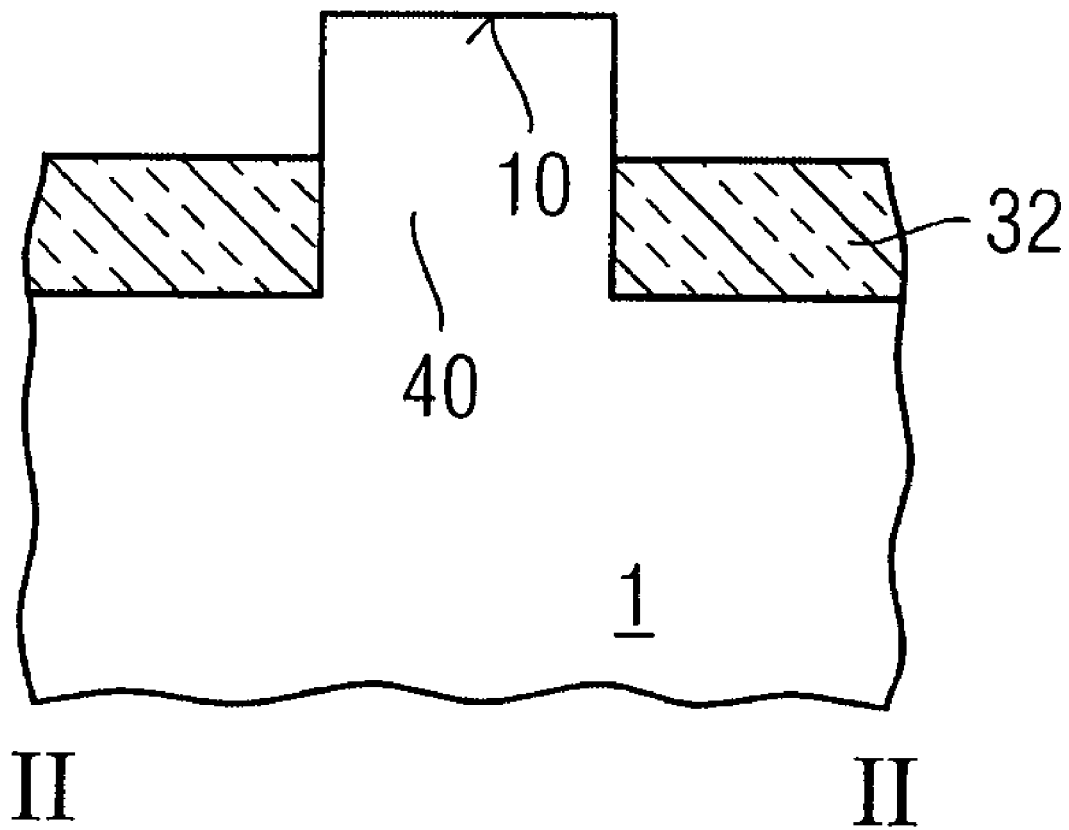

In particular, FIG. 4A shows a plan view of the resulting structure. As can be seen, lines of the silicon nitride layer 11 are disposed on the substrate surface. Moreover, thin lines 15 of the sacrificial spacer are disposed on the substrate surface. Moreover, FIG. 4B shows a cross-sectional view of the structure between I and I. As can be seen, the gate grooves 25 are completed so as to extend below the bottom side 5 of the doped portion 50. Moreover, the gate grooves 25 which are disposed in the first isolation trench portions 31 are widened, due to the silicon dioxide etching step. As can be seen from the cross-sectional view between II and II, which is shown in FIG. 4C, now, the active area 4 has the shape of a ridge 40. Adjacent to the two lateral sides of the ridge 40, the second isolation trench portions 32 are disposed. Moreover, in the upper portion of the ridge, three sides thereof are uncovered.

Thereafter, the gate insulating material 54 is provided. For example, this may be accomplished by performing a thermal oxidation step so as to provide a silicon oxide layer. Thereafter, a conductive filling 55 is provided in each of the gate grooves, followed by a recessing step. For example, the conductive filling may comprise a metal, such as tungsten. For example, the metal filling may be provided by, first, depositing a TiN liner and, thereafter, a tungsten filling. Then, a CMP (chemical mechanical polishing) step is performed, followed by a recessing step. During this recessing step, the conductive material is etched back so that the resulting surface of the metal filling is disposed beneath the substrate surface 10. Accordingly, the top surface 23a of the resulting gate electrode 23 is disposed beneath the surface 10 of the substrate.

Figure 5A:
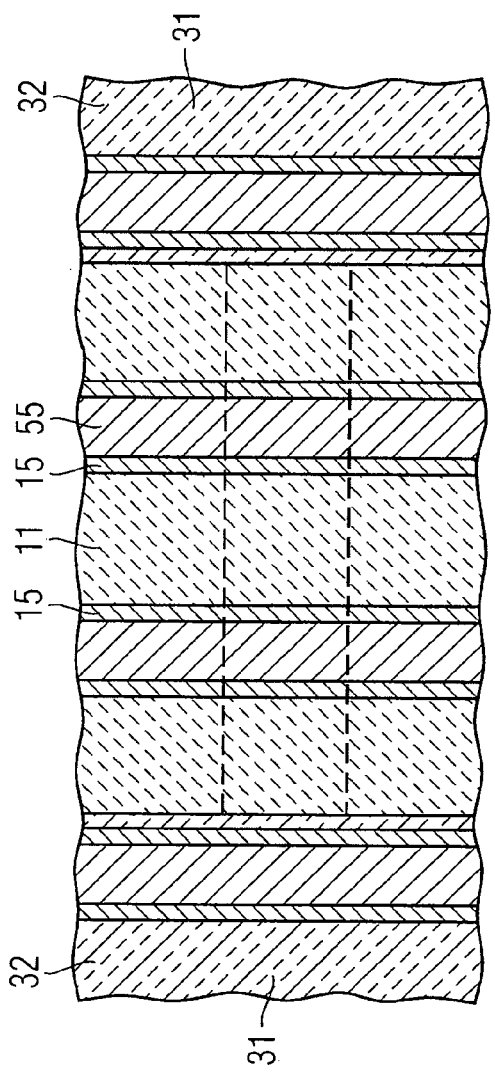
FIGS. 5A to 5C show different views of the substrate after depositing a conductive material in accordance with the invention.
Figure 5B:
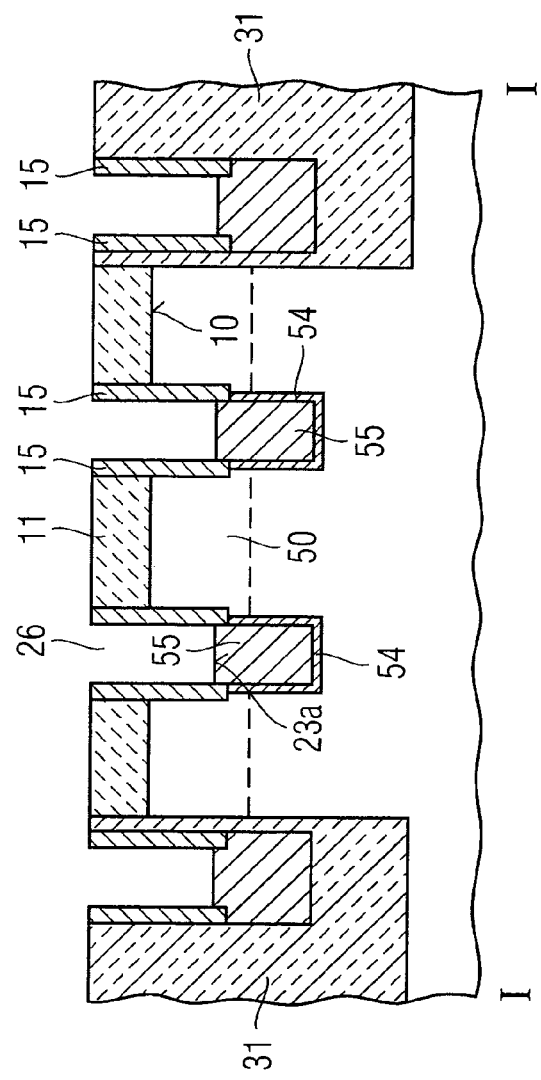
Figure 5C:
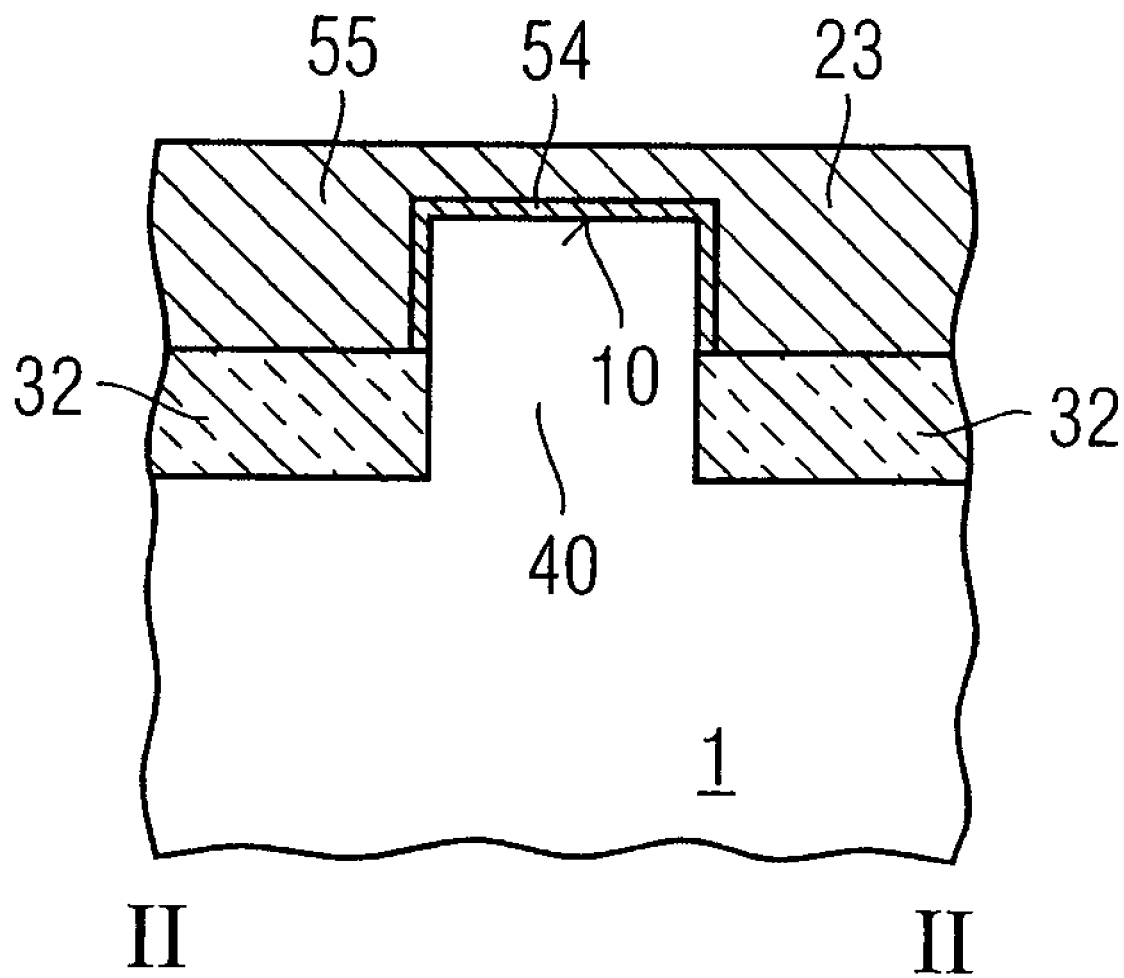

The resulting structure is shown in FIG. 5. As can be seen from FIG. 5A, now, lines of the conductive material 55 are provided, being spaced apart by the silicon nitride lines 11. A cross-sectional view of the resulting structure is shown in FIG. 5B. As can be seen, the top surface 23a of the conductive material 55 is disposed above the bottom side of each of the sacrificial spacers 15. Moreover, the top side 23a of each of the gate electrodes is disposed above the bottom side 5 of the doped portion 50. No filling is disposed in the upper groove portion 26. A further cross-sectional view is shown in FIG. 5C. As can be seen, the gate electrode 23 now is disposed adjacent to three sides of the ridge 40.

Thereafter, the sacrificial spacer is removed. For example a wet etching step using $H_3PO_4$ may be employed so as to remove the silicon nitride spacer 15. By this etching step silicon nitride is etched selectively with respect to tungsten, TiN and silicon oxide. Optionally, thereafter, a re-oxidation step may be performed so as to provide a silicon oxide layer. Thereafter, the silicon oxide filling 56 is provided. For example, this may be accomplished by performing a non-conformal silicon oxide deposition step. For example, this may be accomplished by performing a CVD method for using TEOS (tetraethylorthosilicate) as a starting material. As an alternative, first, a silicon oxide liner may be deposited using a CVD method using TEOS, followed by a HDP (high density plasma) deposition method. During these steps, due to the non-conformal deposition step, a vacuum spacer 57 remains between the upper portion of the conductive material 55 and the sidewalls of the gate groove 25. Accordingly, a vacuum spacer 57 is formed, thus forming a so-called low-k spacer. As an alternative, the space in which the vacuum spacer 57 is formed may as well be filled with an arbitrary low-k dielectric. In this regard, the term "low-k dielectric" refers to a dielectric material having a dielectric constant $\in r<3.9$, that is a dielectric constant which is lower than the dielectric constant of silicon dioxide.

Figure 6C:
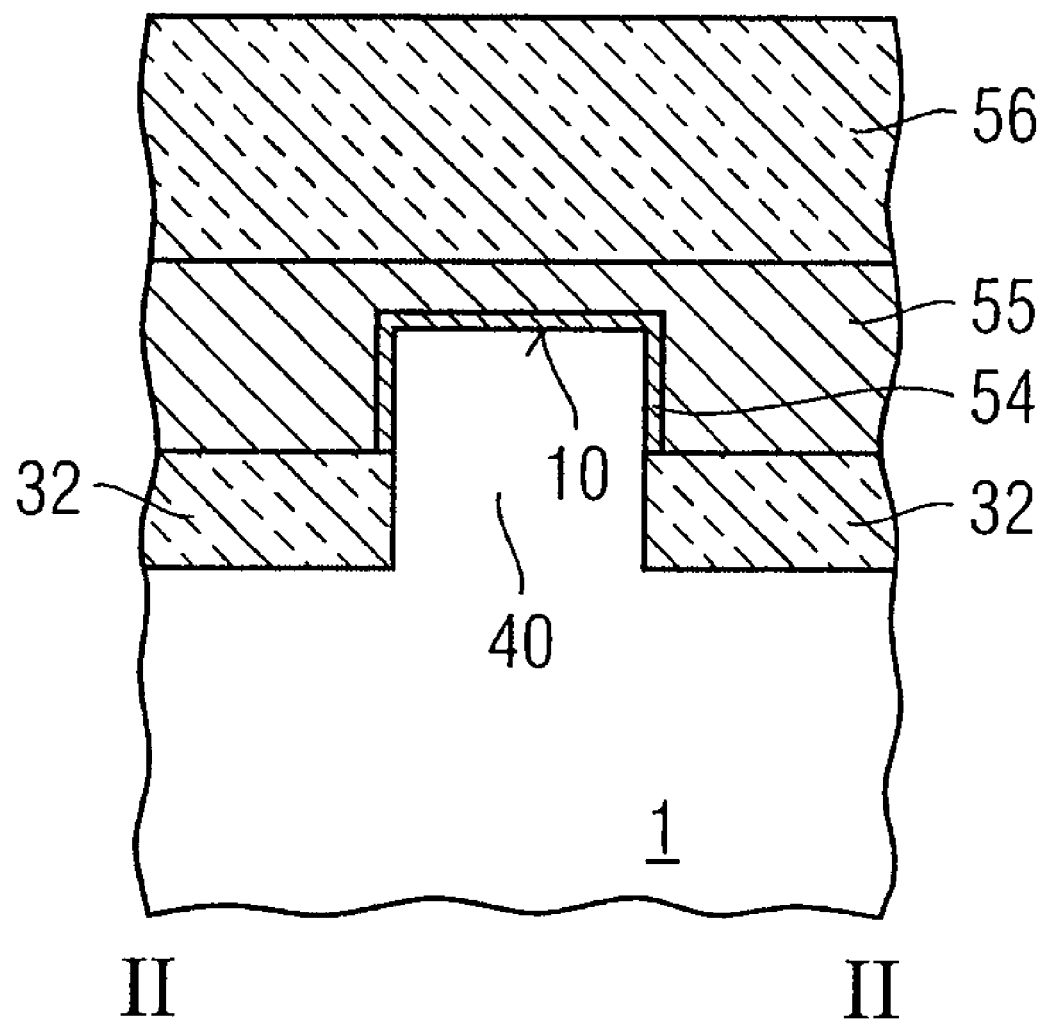

FIG. 6A shows a plan view of the resulting structure. As can be seen, the whole structure now is covered with silicon oxide and silicon nitride lines 11. Moreover, as can be seen from FIG. 6B, the upper portion 26 of the gate groove is filled with silicon oxide material 56. Accordingly, the gate electrode 23 is completely buried, i.e. the upper surface 23a of the gate electrode is disposed beneath the substrate surface 10. FIG. 6C shows a cross-sectional view of the resulting structure between II and II. Thereafter, a deglazing step is performed so as to remove silicon oxide material from the surface. Moreover, the silicon nitride material 11 is stripped from the substrate surface.

Figure 7A:
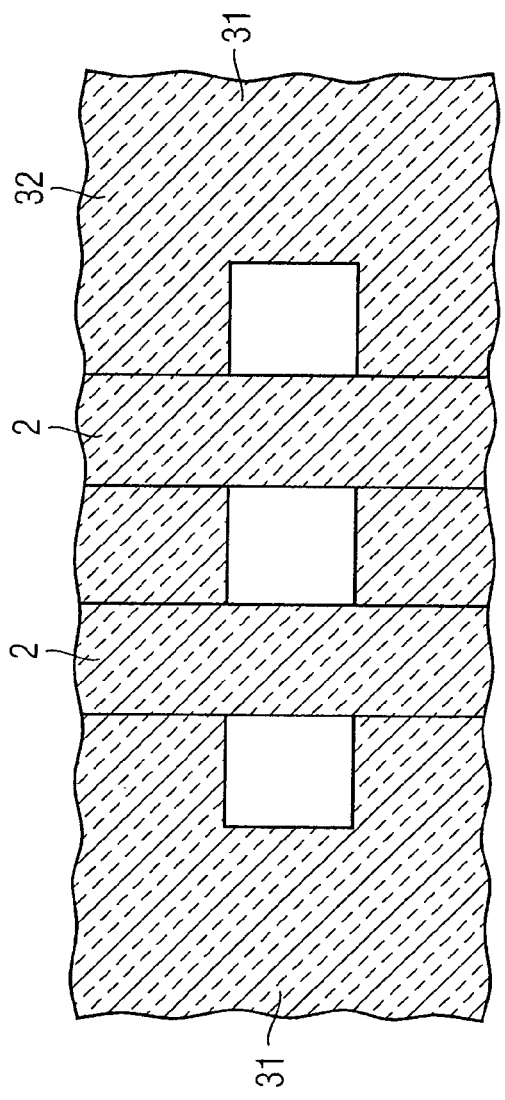
FIGS. 7A and 7B show different views of the substrate after removing the pad nitride layer in accordance with the invention.
Figure 7B:
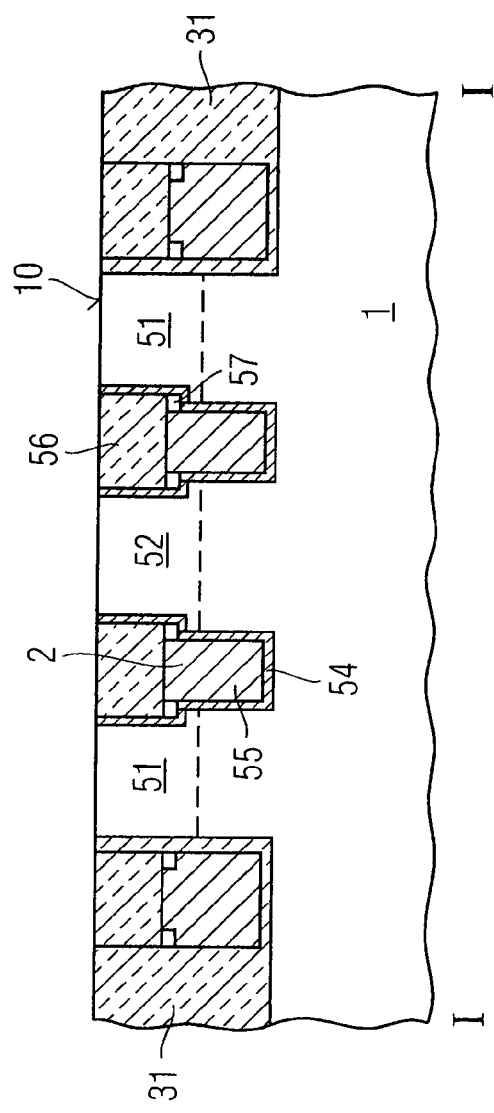

The resulting structure is shown in FIG. 7. In particular, FIG. 7A shows a plan view on the resulting structure. As can be seen, wordlines 2 are formed so as to extend in a first direction. The wordlines 2 are covered with a silicon oxide material. Moreover, FIG. 7B shows a cross-sectional view between I and I. As can be seen, the wordlines 2 are completely buried. The surface of the silicon oxide material 56 is disposed at the same height as the substrate surface 10.

Thereafter, the memory cell array is completed by performing the usual processing steps. In particular, bitlines 8 are provided, which are connected with the corresponding second source/drain regions 52. The bitlines 8 are connected with the corresponding second source/drain regions via a bitline contact 41. Moreover, storage capacitors are provided. By way of example, the storage capacitors may have been provided before performing the process steps which have been described hereinabove with reference to FIGS. 2 to 7. In this case, for example, the trench capacitors may be formed at the position of each of the first isolation trench portions 31. As an alternative, the storage capacitors may as well be implemented as stacked capacitors which are disposed above the substrate surface. In this case, after defining the bitlines 8, node contacts 42 are provided, followed by the steps of patterning the components of the storage capacitor.

Figure 8A:
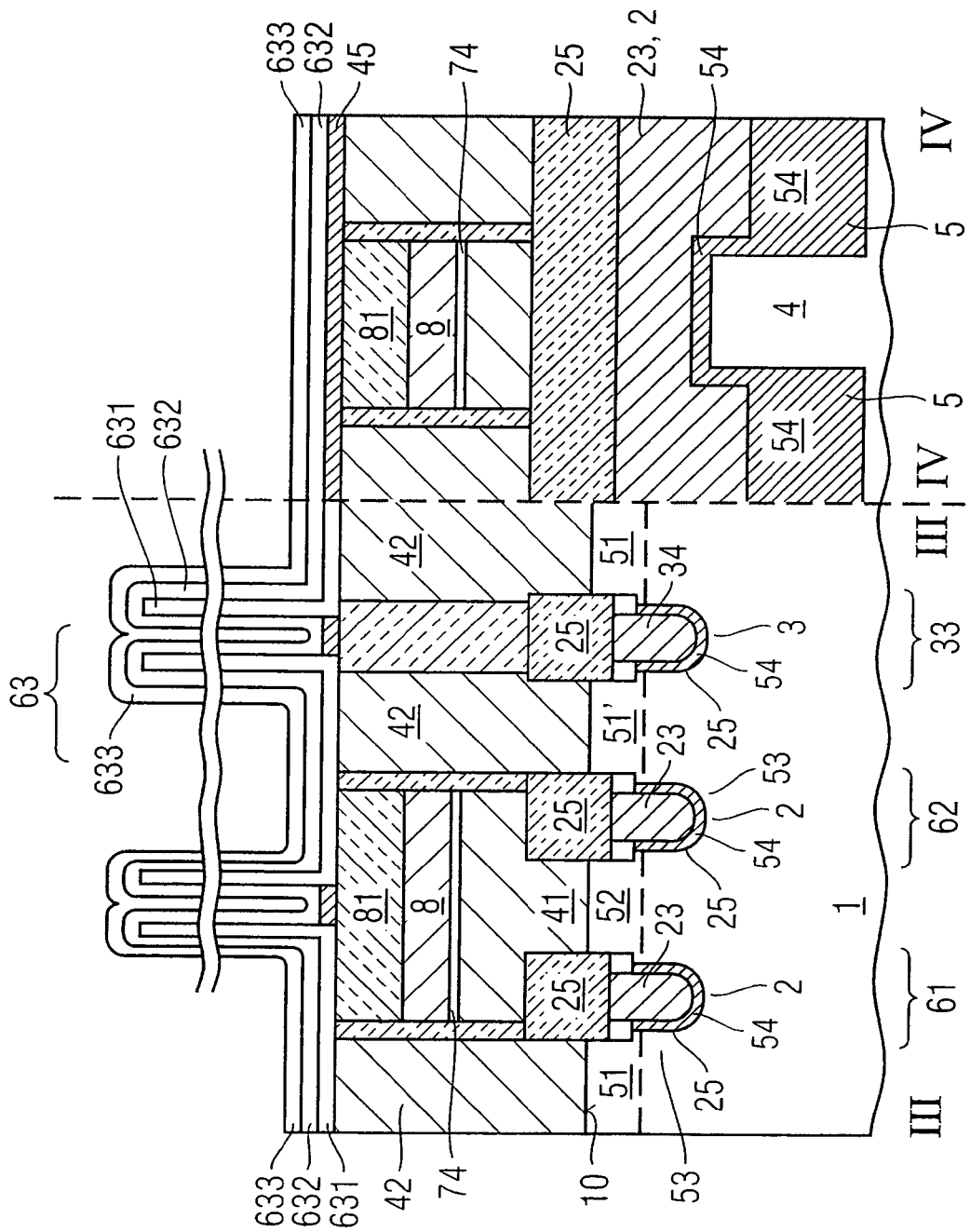
FIG. 8A shows a cross-sectional view of a completed memory cell in accordance with the invention.
Figure 8B:
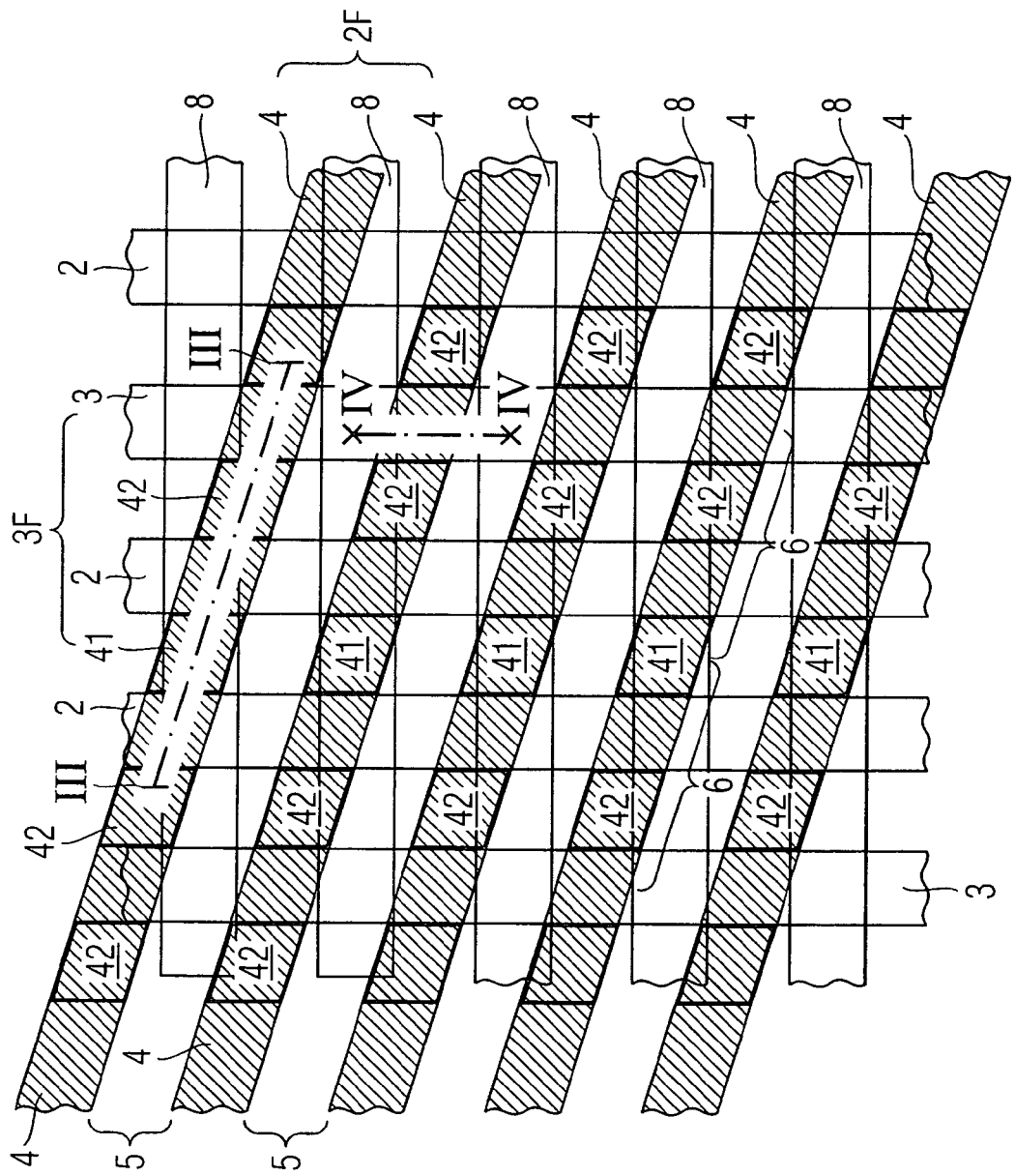
FIG. 8B shows a schematic layout of a completed memory cell array in accordance with the invention.

An exemplary cross-sectional view is shown in FIG. 8A. In particular, FIG. 8A shows a cross-sectional view of a memory cell array depicted in FIG. 8B. In FIG. 8B, also the positions of the respective cross-sectional views between III and III as well as between IV and IV are illustrated. As can be seen from FIG. 8B the wordlines 2 are disposed perpendicularly with respect to the bitlines 8, whereas the active areas intersect the wordlines as well as the bitlines at an angle which is different from 90°. As is shown in FIG. 8A, the stacked capacitor comprises a storage electrode 631, a capacitor dielectric 632 as well as a second capacitor electrode 633. The first capacitor electrode 631 is connected with the first source/drain region 51' via a bitline contact 42. A channel 53 is formed between the first and the second source/drain region 51', 52. The conductivity of the channel 53 is controlled by the gate electrode 23 of the transistor 62. When an appropriate voltage is applied to the gate electrode 23 of the access transistor 62, an information is read out from the storage capacitor 63. In particular, a charge stored in the corresponding first capacitor electrode 631 is sensed via the bitline contact 42. The information is transmitted from the first source/drain region 51' to the second source/drain region 52 and sensed by the corresponding bitline 8 via the bitline contact 41. As can be seen from FIG. 8A, the transistor is formed in the manner as has been described hereinabove with reference to FIGS. 1 to 7. The bitline 8 is disposed beneath the storage capacitor 63. The left hand portion of FIG. 8 shows a cross-sectional view of the memory cell between III and III, whereas the right hand portion of FIG. 8A shows the cross-sectional view which is taken between IV and IV. In the lower portion of the right hand portion of FIG. 8A, the corresponding transistor is shown. As can be seen, the bitline 8 extends in the direction which is perpendicular to the plane of the drawing, whereas the wordline 2 is in the direction of the plane of the drawing.

As is further shown in the cross-sectional view between III and III, an insulation gate line 3 is provided, by which adjacent memory cells are electrically insulated from each other. To be more specific, an insulation device 33 is provided, comprising a gate electrode 34 which controls an electrical current flowing between the first source/drain region 51 and the adjacent first source/drain region 51'. By applying an appropriate voltage to the gate electrode 34 of the insulation device 33, a current flow between the first source/drain region 51 and the adjacent first source/drain region 51' is avoided. Accordingly, the insulation gate line 3 serves as an insulation device.

FIG. 8B shows a plan view of the resulting structure. As can be seen, the wordlines 2 extend in a first direction, whereas the bitlines 8 extend in a second direction which is perpendicular with respect to the first direction. The active areas 4 are formed as continuous lines and are disposed in a direction which is neither along the first nor along the second direction. To be more specific, the continuous active area lines 4 intersect the wordlines 2 as well as the bitlines 8. In the plan view of FIG. 8B, also the corresponding node contacts 42 and bitline contacts 41 are shown.

Figure 9:
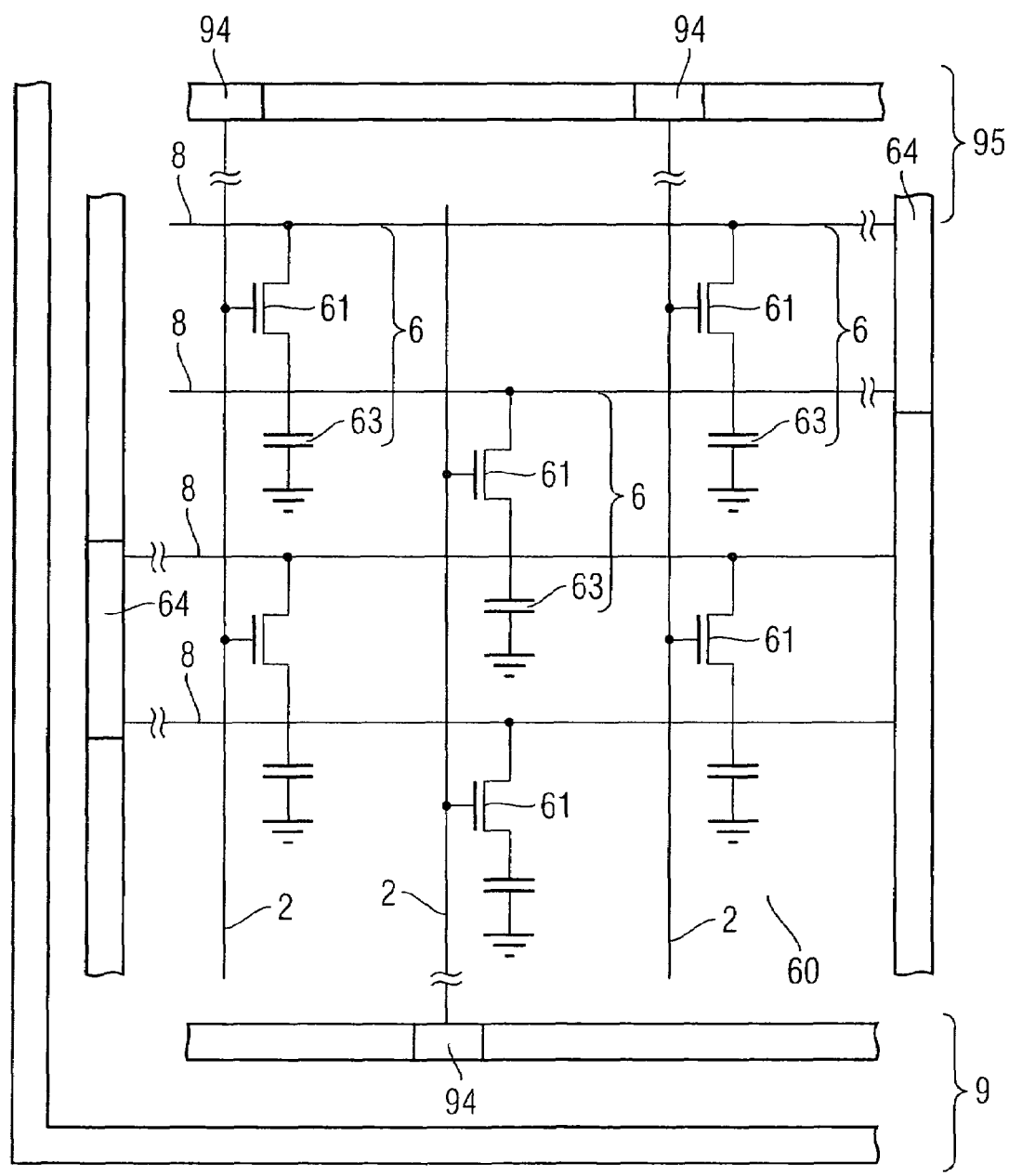
FIG. 9 shows a plan view of a completed memory device in accordance with the invention.

FIG. 9 shows a schematic layout of the corresponding memory device. As can be seen, a plurality of memory cells 6 are disposed in the memory cell array 60. Each of the memory cells 6 comprises a storage capacitor 63 as well as an access transistor 61. Wordlines 2 are provided and they are coupled to each of the gate electrodes which are assigned to the respective wordlines 2. Moreover, the bitlines are connected with the second source/drain regions of the corresponding access transistors. The memory device further comprises a peripheral portion 9, comprising the support portion 95. In particular, the support portion 95 comprises the wordline drivers 94 as well as the sense amplifiers 64.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCES 1 semiconductor substrate
10 substrate surface
11 silicon nitride layer
12 hardmask layer
13 hardmask opening
14 sacrificial liner
15 sacrificial spacer
2 wordline
23 gate electrode
23a top surface
24 plate-like portions
25 gate groove
25a bottom side of gate groove
26 upper portion of gate groove
3 isolation gate line
31 first isolation trench portion
32 second isolation trench portion
33 isolation transistor
34 isolation gate electrode
4 active area
40 fin portion
41 bitline contact
42 node contact
5 bottom side of doped portion
50 doped region
51,51' first source/drain region
52 second source/drain region
53 channel
54 gate insulating layer
55 metal filling
56 $SiO_2$ filling
57 vacuum spacer
58 bottom side of vacuum spacer
6 memory cell
60 memory cell array
61 first access transistor
62 second access transistor
63 storage capacitor
631 first capacitor electrode
632 capacitor dielectric
633 second capacitor electrode
64 sense amplifier
74 barrier layer
8 bitline
81 bitline cap layer
9 peripheral portion
94 wordline driver
95 support

What is claimed:

1. An integrated circuit including a transistor, the transistor comprising:

first and second source/drain regions formed in a semiconductor material and extending at least to a first depth with respect to a top surface of the semiconductor material;

a channel region disposed between the first and second source/drain regions and comprising a fin-like portion including a ridge with a top side and two lateral sides in a cross-section perpendicular to a first direction defined by a line extending between the first and second source/drain regions; and a gate electrode disposed in a gate groove defined in a top surface of the semiconductor material between the first and second source/drain regions;

wherein a top surface of the gate electrode is disposed between the top surface of the semiconductor material and the first depth; and wherein the gate electrode surrounds the ridge at the top side and the two lateral sides.

2. The integrated circuit of claim 1, further comprising a spacer comprising a dielectric material, the spacer being disposed adjacent a sidewall of the gate groove and located between the gate electrode and the semiconductor material, wherein a bottom side of the spacer is disposed at a depth no greater than the first depth.

3. The integrated circuit of claim 1, wherein the first source/drain region, the second source/drain region, and the channel region are formed in an active area defined by two opposing isolation trenches, and a width of the ridge is equal to the width of the active area, the width being defined along the first direction.

4. The integrated circuit of claim 1, further comprising at least one vacuum spacer disposed adjacent one of the sidewalls of the gate groove and located between the gate electrode and the semiconductor material, wherein a bottom side of the vacuum spacer is disposed at a depth no greater than the first depth.

5. The integrated circuit of claim 4, wherein a width of the gate groove between a bottom edge of the vacuum spacer and the top surface of the semiconductor material is larger than a width of the gate groove below the bottom edge of the vacuum spacer.

6. The integrated circuit of claim 4, wherein the gate groove has a step at the position of the bottom side of the vacuum spacer.

7. An integrated circuit including a memory cell array comprising:

a plurality of bit lines extending in a first direction;

a plurality of memory cells, each of the memory cells comprising a storage element and an access transistor configured to electrically couple the storage element to one of the bit lines, wherein individual ones of the access transistors are formed in a semiconductor material and comprise:
- doped portions arranged adjacent a top surface of the semiconductor material and extending to a first depth, wherein the doped portions of each of the access transistors comprise a first source/drain region and a second source/drain region;
- a channel region formed between the first and second source/drain regions and comprising a fin-like portion including a ridge with a top side and two lateral sides in a cross-section perpendicular to a first direction defined by a line extending between the first and second source/drain regions; and
- a gate electrode surrounding the ridge at the top side and the two lateral sides; and a plurality of word lines configured to address the access transistors and extending in a second direction intersecting the first direction;

wherein a top surface of each of the word lines is disposed at a depth between the top surface of the semiconductor material and the first depth.

8. The integrated circuit of claim 7, wherein a plurality of isolation trenches are formed in the semiconductor material to define active areas between the isolation trenches, wherein the isolation trenches are configured to insulate adjacent active areas from each other, and the access transistors are formed in the active areas.

9. The integrated circuit of claim 7, wherein the storage elements comprise storage capacitors formed in the semiconductor material.

10. The integrated circuit of claim 7, wherein the storage elements comprise storage capacitors formed above the semiconductor material.

11. The integrated circuit of claim 7, wherein the gate electrode forms part of a corresponding word line.

12. The integrated circuit of claim 11, wherein each gate electrode is disposed in a gate groove extending in the top surface of the semiconductor material between the first and the second source/drain regions of each access transistor.

* * * * *